United States Patent [19]

Jones

[11] Patent Number: 4,668,920

[45] Date of Patent: May 26, 1987

[54] POWER DIVIDER/COMBINER CIRCUIT

[75] Inventor: Keith E. Jones, Aloha, Oreg.

[73] Assignee: Tektronix, Inc., Beaverton, Oreg.

[21] Appl. No.: 852,092

[22] Filed: Apr. 14, 1986

Related U.S. Application Data

[63] Continuation of Ser. No. 653,164, Sep. 24, 1984, abandoned.

[51] Int. Cl.[4] .............................................. H03F 3/60
[52] U.S. Cl. .................................... 330/286; 330/53; 330/277
[58] Field of Search ................. 330/53, 264, 277, 286; 333/100, 116, 124–128, 136

[56] References Cited

U.S. PATENT DOCUMENTS

| 3,129,387 | 4/1964 | Sosin | 330/53 |
| 3,516,024 | 6/1970 | Lange | 333/116 |
| 4,263,559 | 4/1981 | Ho | 330/53 |

OTHER PUBLICATIONS

Ayasli, Y., et al., "2-20 Ghz GaAs Traveling-Wave Power Amplifier", *IEEE Microwave and Millimeter-Wave Monolithic Circuits Symposium 1983*, pp. 67–70.

*Primary Examiner*—Eugene R. LaRoche
*Assistant Examiner*—Steven J. Mottola
*Attorney, Agent, or Firm*—John P. Dellett; Francis I. Gray

[57] ABSTRACT

A broadband, monolithic integrated-circuit power divider/combiner circuit utilizing gallium arsenide field-effect transistors configured as distributed amplifiers. Two distributed amplifiers include a common merged transmission line element which divides/combines the input signal(s).

5 Claims, 4 Drawing Figures

POWER DIVIDER/COMBINER CIRCUIT

This is a continuation of application Ser. No. 653,164, filed Sept. 24, 1984, and now abandoned.

BACKGROUND OF THE INVENTION

This invention relates to power divider/combiner circuits, and more particularly to a monolithic broadband power divider/combiner having amplification inherent in the circuit.

Increasing the power-handling capabilities of solid state devices by increasing their size, or by connecting several of them in parallel or in series within a package, can cause problems related to impedance matching, instability, heat dissipation, reliability and yield. This creates the need for power combining of complete amplifiers or oscillators.

In the past power-combining circuits have utilized discrete amplifiers having inputs connected to a power source through a power divider, and outputs connected through a power combiner to a single output port. N-way hybrid power dividers and combiners are well-known in the art. Hybrid power dividers and combiners are actually identical in structure, except their input and output terminals are reversed. Radial and fork hybrid divider/combiner structures are a class of devices first described by Wilkinson, U.S. Pat. No. 3,091,743, which are suitable for narrowband applications. Considerable broadbanding can be achieved by utilizing stepped stripline quarter-wave elements, or by cascading techniques wherein the lines become odd numbers of quarter-wave lengths beyond 1; however, the application and the mathematical relationships of these may become unwieldy.

The distributed amplifier is a high-gain, wideband amplifier which has been used widely in various kinds of electronic equipment. With the advance of modern integrated-circuit technology and with the aid of computers, distributed amplifiers have been designed and built on microstrip with MOSFETs; however, these devices are not suitable for operation in the 10 to 50 GHz region of the microwave spectrum.

In view of the foregoing, it is an object of the present invention to provide improved power divider/combiner circuits for broadband operation.

It is another object of the present invention to provide improved microwave power divider/combiner circuits which are batch processable, monolithic integrated circuits.

Another object of the present invention is to provide improved monolithic power divider/combiner devices for broadband operation in the microwave spectrum and having amplifier circuits inherent in the devices.

It is a more specific object of the present invention to provide an improved power combining circuit having amplification inherent in the divider/combiner devices thereof.

SUMMARY OF THE INVENTION

In accordance with one aspect of the present invention, there is provided a broadband power divider circuit receiving an input power wave in an input-wave transmission line which is common to a pair of distributed amplifiers. Output-wave transmission lines of each of the distributed amplifiers couple the divided, equi-phase, equal-amplitude power wave to output ports. In a preferred embodiment of the invention, the distributed amplifiers are formed as monolithic gallium arsenide integrated circuits.

In accordance with another aspect of the present invention, there is provided an improved power combining circuit comprising a power divider coupled to a power combiner. The divider and combiner each comprise a pair of merged distributed amplifiers, the distributed amplifiers of the power divider having a merged input-wave transmission line receiving the input signal, and the distributed amplifiers of the power combiner having a merged output-wave transmission line delivering the output signal. The output-wave transmission lines of the power divider are coupled to the input-wave transmission lines of the power combiner.

While the invention is set forth with particularity in the appended claims, other objects, features and advantages of the invention will become more apparent and the invention will best be understood by referring to the following detailed description in conjunction with the accompanying drawing.

DESCRIPTION OF THE PREFERRED EMBODIMENT

Figure 1:
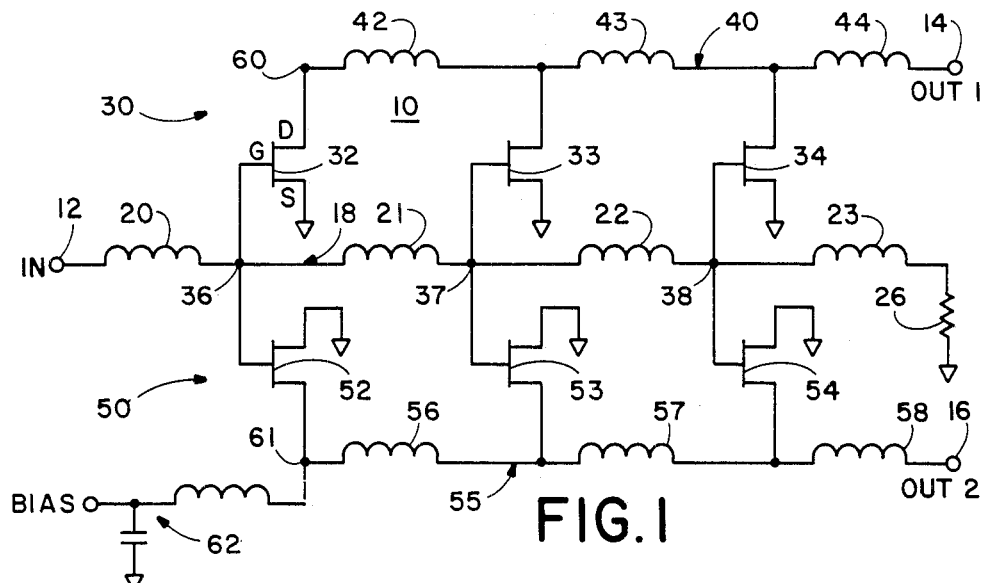
FIG. 1 is an electrical schematic diagram of a power divider circuit in accordance with the instant invention.

Referring now to the drawing for a more detailed description of the construction, operation and other features of the invention by characters of reference, FIG. 1 shows a power divider circuit 10 receiving an input signal at an input terminal 12 to divide the applied power for delivery to output terminals 14, 16. The signal on the input terminal 12 is applied to an input-wave transmission line 18 comprised of a series of inductors 20–23 and a termination impedance 26. A first, three-section distributed amplifier 30 is comprised of three field-effect transistors (FET) 32, 33, 34. Each of the FETs 32, 33, 34 includes a gate G, a source S, and a drain D as illustrated by the literal designations adjacent the FET 32 in FIG. 1. The gates of the FETs 32, 33, 34 are connected to the input-wave transmission line 18, respectively, at junction points 36, 37, 38 intermediate the inductors 20, 21, 22, 23. The source of each of the FETs 32, 33, 34 is grounded. The drains of the FETs 32, 33, 34 are connected to a first output-wave transmission line 40 which is comprised of inductors 42, 43, 44. The output wave transmission line 40 is coupled to the output terminal 14. The output-wave transmission line 40 is formed by utilizing the drain-to-source capacitance of the FETs 32, 33, 34 to shunt, respectively, the inductors 42, 43, 44 in a manner well known in the art. See E. L. Ginzton, et. al., "Distributed Amplification," *Proc. IRE*, vol. 36, pp. 956–969, August, 1948; and Pettit and McWhorter "Electronic Amplifier Circuits," McGraw-Hill Book Co, New York, N.Y., 1961, chap. 6, "Additive Amplification."

A second, three-section distributed amplifier 50 is comprised of FETs 52, 53, 54 having gates connected, respectively, to the same junction points 36, 37, 38 of the input-wave transmission line 18 as the FETs 32, 33, 34 of the other distributed amplifier 30. The sources of the FETs 52, 53, 54 are grounded. The drains of the FETs 52, 53, 54 are connected to a second output-wave transmission line 55 of the second distributed amplifier 50. The second output-wave transmission line 55 is coupled to the output terminal 16. The transmission line 55 is comprised of inductors 56, 57, 58 which are shunted, respectively, by the drain-to-source capacitance of the FETs 52, 53, 54.

Power division/combining is achieved in the instant invention by merging the input/output transmission lines of two distributed amplifiers. Referring still to FIG. 1, the input-wave or gate transmission line 18 is common to both distributed amplifiers 30, 50, and utilizes the merged gate-to-source capacitances of the pair of FETs in each of the respective sections of the merged distributed amplifiers to shunt the corresponding inductor of the gate line 18.

The power divider circuit 10 of FIG. 1 is conveniently formed as a planar monolithic structure on a substrate of semiconductor material, preferably gallium arsenide for operation in the microwave spectrum. The inductors are planar elements with crossovers. Drain bias may be applied through the output terminals 14, 16, or alternatively on the chip through AC coupled terminations connected respectively at junction points 60, 61 of the transmission lines 40, 55. One such drain bias input means 62 is shown in FIG. 1 connected to the junction point 61 by dashed lines to indicate that the connection is optional. Gate bias can be similarly applied through the input terminal 12, or on the chip through an AC coupled termination (not shown) connected to the gate line 18.

The merged distributed amplifiers 30, 50 of the power divider circuit 10 provide two-way power division with inherent gain and the increased bandwidth characteristic of distributed amplifiers. The instant embodiment is described having three sections in each of the merged distributed amplifiers stages; the number of FETs per stage may be varied to achieve the gain and bandwidth desired. The output wave or drain transmission lines 40, 55 are designed with tapered line sections so that reverse terminations are not required; therefore, substantially the entire output current of the FETs is effectively used in the output loads. The lines 40, 55 may also be designed with reverse termination impedances, thereby providing for D.C. operation.

Figures 2, 3:
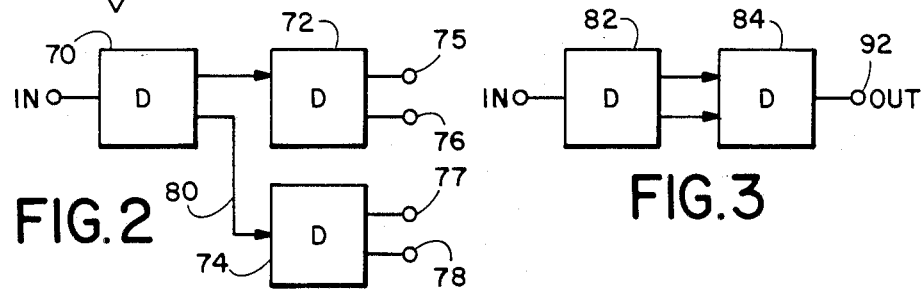
FIG. 2 is a block diagram of a power divider in accordance with the present invention.
FIG. 3 is a block diagram of a power combining circuit in accordance with the present invention.

The power divider circuit 10 of FIG. 1 may be cascaded with other like circuits to form multiple-output dividers. FIG. 2 shows a power divider circuit 70 like the power divider circuit 10 of claim 1 having its output terminals coupled to two like power divider circuits 72, 74, thus realizing a four-way divider having output terminals 75–78. In such n-way dividers wherein the number of output ports is equal to a power of two, any reflected power waves generated by the output loads inherently cancel. When the number of output ports is not equal to $2^x$, means must be provided for shifting the phase of certain of the output signals in order to achieve equiphase outputs. For example, referring again to FIG. 2, a 3-way power divider circuit comprising two divider circuits 70, 72 and having three output terminals 75, 76, 80 would require a phase shifter at the third output 80 to achieve equiphase outputs at all the output terminals.

Alternatively, a three-way divider having equiphase outputs can be realized with the 4-way structure of FIG. 2 by dissipating one of the outputs in a matched load.

Figure 4:
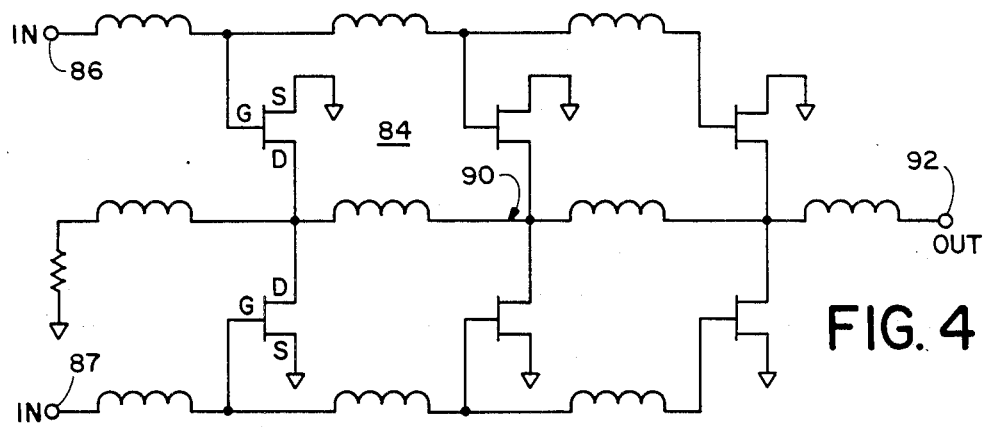
FIG. 4 is an electrical schematic diagram of a power combiner circuit in accordance with the present invention.

Referring to FIG. 3 in conjunction with FIGS. 1 and 4, there is shown in FIG. 3 a power combining circuit having amplification inherent in power divider and combiner elements. A power divider circuit 82, like the divider circuit 10 of FIG. 1, is coupled to a power combiner circuit 84. The power combiner circuit 84 is identical to the FIG. 1 circuit except that the gates and drains of the FETs in the distributed amplifiers are reversed as shown in detail in FIG. 4. The output terminals of the divider circuit 82 are capacitively coupled to the input terminals 86, 87 of the power combiner 84. A merged drain or output-wave transmission line 90 couples the combined and amplified output signal to a single output terminal 92.

There has been disclosed herein an improved broadband microwave power divider/combiner having merged distributed amplifier stages. Many modifications and variations of the invention are possible in light of the above teachings. For example, the power combining circuit as shown in FIG. 3 may include discrete amplifier stages intermediate the power divider 82 and the power combiner 84. The appended claims are intended to cover and embrace any such modifications which fall within the true spirit and scope of the invention.

I claim:

1. A power divider, comprising:
   an input port receiving an input power wave;
   first and second output ports; and
   first and second distributed amplifiers, each of said distributed amplifiers having an output-wave transmission line coupled to a respective one of said first and second output ports, said distributed amplifiers including an input-wave transmission line in common, the input-wave transmission line being coupled to said input port;
   whereby the input power wave is divided into two equal amplitude, in-phase output power waves.

2. The power divider of claim 1 wherein each of the distributed amplifiers comprises at least two sections, each of the sections including a transistor having an input terminal and an output terminal with associated capacitance, an inductor of the respective output-wave transmission line, and an inductor of the common input-wave transmission line, the input terminal of each of the transistors being connected to the common input-wave transmission line, the merged input terminal capacitances of one of the transistors of each of the first and second distributed amplifiers and the common inductor forming one of the sections of the input-wave transmission line of the distributed amplifiers, the output terminal of each of the transistors being connected to the respective output-wave transmission line, and the output terminal capacitance of each of the transistors and the inductor of the respective output-wave transmission line forming one of the sections of the output-wave transmission line of the respective distributed amplifier.

3. The power divider of claim 2, wherein the power divider is a monolithic structure formed on a substrate of semiconductor material.

4. The power divider of claim 3, wherein the transistors are field-effect transistors and the substrate is gallium arsenide.

5. An n-way power divider comprising a plurality of power divider stages connected in cascade, each of said power divider stages having an input terminal and a pair of output terminals such that said output terminals are connected to said input terminals of subsequent ones of said power divider stages, each of said power divider stages further having a pair of distributed amplifiers with respective output-wave transmission lines coupled to respective ones of said output terminals and a common input-wave transmission line coupled to said input terminal.

* * * * *